United States Patent [19]

Donohue et al.

[11] 4,225,468

[45] Sep. 30, 1980

[54] TEMPERATURE COEFFICIENT OF RESISTANCE MODIFIERS FOR THICK FILM RESISTORS

[75] Inventors: Paul C. Donohue; Sanford M. Marcus, both of Wilmington, Del.

[73] Assignee: E. I. Du Pont de Nemours and Company, Wilmington, Del.

[21] Appl. No.: 934,270

[22] Filed: Aug. 16, 1978

[51] Int. Cl.$^2$ ............................................. H01B 1/06
[52] U.S. Cl. .................................. 252/509; 252/510; 252/511; 252/518; 252/520; 252/521
[58] Field of Search ............... 252/518, 520, 521, 509, 252/516, 512, 510, 511

[56] References Cited

U.S. PATENT DOCUMENTS

| | | | |
|---|---|---|---|
| 3,277,020 | 10/1966 | Janakirama-Rao | 252/520 X |
| 3,770,478 | 11/1973 | Bishop | 260/39 P X |
| 3,868,334 | 2/1975 | Van Loan | 252/520 |

FOREIGN PATENT DOCUMENTS 1282023  7/1972  United Kingdom.

OTHER PUBLICATIONS

Valeev, Kh. S. et al., Chemical Abstracts 85, (1976), 135965u, "Semiconductor Ceramic Material for Producing Volume-type Resistors".

Smirnov, M. A. et al., Chemical Abstracts 79, (1973), 109218j, "Resistance Materials Made of Lanthanum Hexaboride and Glass".

*Primary Examiner*—Benjamin R. Padgett
*Assistant Examiner*—J. Lloyd Barr

[57] ABSTRACT

Temperature coefficient of resistance (TCR) modifiers, useful in thick film resistor compositions, which can be fired in nonoxidizing atmosphere and which are based on $LaB_6$ and glass powders dispersed in a vehicle, are provided. Among such TCR modifiers are included TiO, Ge, Si, and graphite.

6 Claims, No Drawings

TEMPERATURE COEFFICIENT OF RESISTANCE MODIFIERS FOR THICK FILM RESISTORS

DESCRIPTION

Technical Field

This invention relates to temperature coefficient of resistance (TCR) and modifiers for thick film resistors and more particularly to TCR modifiers for $LaB_6$-based resistors fireable in nonoxidizing atmosphere.

BACKGROUND ART

Resistor and conductor compositions which are applied to and fired on dielectric substances (glass, glass-ceramic, and ceramic) usually comprise finely divided inorganic powders (e.g., metal particles and binder particles) and are commonly applied to substrates using so-called "thick film" techniques, as a dispersion of these inorganic powders in an inert liquid medium or vehicle. Upon firing or sintering of the film, the metallic component of the composition provides the functional (resistive or conductive) utility, while the inorganic binder (e.g., glass, crystalline oxides such as $Bi_2O_3$, etc.) bonds the metal particles to one another and to the substrate. Thick film techniques are contrasted with thin film techniques which involve deposition of particles by evaporation or sputtering. Thick film techniques are discussed in "Handbook of Materials and Processes for Electronics", C. A. Harper, Editor, McGraw-Hill, N.Y., 1970, Chapter 12.

One of the important characteristics of electrical resistors is their TCR. Many electrical resistors of the prior art, based on, e.g., precious metals, possess certain undesirable properties such as high TCR. See, e.g., D'Andrea, U.S. Pat. No. 2,924,540, issued Feb. 9, 1960 and Dumesnil, U.S. Pat. No. 3,052,573, issued Sept. 4, 1962.

More recently certain electrically conductive materials were found whose resistivity is virtually independent of temperature over a wide range of temperatures. See, e.g., Bouchard, U.S. Pat. No. 3,583,931, issued June 8, 1971 and Hoffman, U.S. Pat. No. 3,553,109, issued Jan. 5, 1971. Resistors based on the pyrochlore-related materials described in the above two patents, however, were found to be incompatible with copper conductors under certain conditions.

Resistors compatible with copper conductors have been found recently and are described in a copending application Ser. No. 934,269, filed Aug. 16, 1978 filed concurrently with the present application. Although these resistors have relatively low TCR values, there are many applications which require even lower TCR's.

DISCLOSURE OF THE INVENTION

The TCR modifiers of this invention comprise 1–20 parts by weight of the solids content of the resistor compositions. The solids content of the resistor compositions of this invention consists essentially of a conductive material such as lanthanum hexaboride ($LaB_6$), yttrium hexaboride ($YB_6$), the rare earth hexaborides, calcium hexaboride ($CaB_6$), barium hexaboride ($BaB_6$), strontium hexaboride ($SrB_6$) or mixtures thereof; glass; and TCR modifiers. The weight ratio of hexaboride to glass is from 10:90 to 95:5.

The resistor composition comprises the above solids content dispersed in a vehicle which can be a solution of an organic polymeric material in a solvent, is compatible with copper conductors, and is fireable in a nonoxidizing atmosphere. The TCR modifiers of this invention are semiconductors and include TiO, Si, Ge, and C.

DESCRIPTION OF THE INVENTION

The TCR modifiers of this invention comprise 1–20 parts by weight based on the solids content of the resistor composition of this invention, perferably 2.5–15 parts, and more preferably 2.5–10 parts. Another preferred range is 1–4 part by weight.

In general, thick film resistor compositions have, unless modified, relatively large positive TCR values at the low resistivity range of the resistor films and negative values in the high resistivity range. Such a behavior is thought to occur because of the domination of the metallic functional phase in the low resistivity range while, in the high resistivity range, the semiconducting characteristic of the functional phase-glass junctions dominate.

To be useful TCR modifiers for resistor composition of the instant invention, the TCR modifiers of this invention have to be substantially nonreactive with the hexaboride functional phase and nonreducible by the hexaboride.

The TCR modifiers meeting the above criteria are TiO, its higher oxidation state precursors $Ti_3O_5$ and $Ti_2O_3$, NbO, TaO, C, Si, Ge, SiC, compounds based on groups IIIA and VA of the periodic chart of the elements such as gallium arsenide, GaAs, compounds based on Groups IIB and VIA of the periodic chart such as cadmium telluride, CdTe, rare earth nitrides, certain Group IIIB nitrides such as LaN or mixtures thereof.

The present inventive selection of TCR modifiers for the resistor compositions described herein is based on a combination of considerations.

Although a reaction scheme according to the equation below can be visualized, such a reaction is thought to occur to a limited degree only, if at all, and, therefore, Si, etc. are suitable as TCR modifiers in the present invention: $LaB_6 + xSi \rightarrow LaSi_x + 6B$.

Si, C, Ge are also resistant to reduction by the hexaborides; $SiH_4$, $CH_4$, $GeH_4$ are thought to be unlikely end products in presence of hexaborides.

It is known that hexaborides such as $LaB_6$ are strong reducing agents; their reaction with metal oxides (MO) is shown below:

$$LaB_6 + 10.5 MO \rightarrow 0.5 La_2O_3 + 3B_2O_3 + 10.5 M$$

Based on thermodynamic calculations and approximations, the Gibbs free energy of formation, $\Delta F°$, will be zero (at 900° C., the approximate average temperature at which the thick film resistor films are formed from the compositions of this invention) when $\Delta F°$ (M-O) is approximately $-80.8$ kcal/mole. This means that only those semiconductor oxides will be satisfactory TCR modifiers of this invention which have $\Delta F°$ (per each M-O bond in the molecule) less than $-80.8$ kcal/mole. Under these circumstances there can be no reaction between $LaB_6$ and the TCR modifier oxides. For example, $\Delta F°$ (at 900° C.) of TiO is $-96.65$ kcal/mole, theoretically showing it to be a satisfactory TCR modifier of this invention.

Although $\Delta F°$ values (at 1200° K.) for $Ti_2O_3$ and $Ti_3O_5$ are $-94.8$ and $-92.0$ kcal/Ti-O bond, respectively, and therefore no reduction by $LaB_6$ is expected, potential stepwise reduction during firing would lead to TiO, a good TCR modifier. (The thermodynamic data utilized herein are based on tabulations in Bulletin 542, Bureau of Mines, "Contributions to the Data on Theoretical Metallurgy; XII. Heats and Free Energies of Formation of Inorganic Oxides" by J. P. Coughlin, 1954. $\Delta F°_{LaB_6}$ was estimated to be approximately 10% less than its reported $\Delta H°$ of $-30.7$ kcal/mole; see Chem. Abstr., 70:61844 v.)

Among the TCR modifiers disclosed above, TiO, Ge, Si and C (in crystalline graphite form) are preferred. Their utilization leads to thick film resistor films of good electrical properties, stability, and adhesion to substrate.

The effectiveness of these TCR modifiers can only be judged in its proper perspective if, in addition to lowering the TCR value of a resistor to which it had been added toward the ideal value of zero, the modified resistor is to the left of the so-called "universal" curve.

It has been found that for a given thick film resistor system (same conductor, similar types and amounts of glasses of similar particle size), the plot of TCR values versus the log of resistivity (ohms/square/thickness) is a curve approaching a straight line having a negative slope. The line passes from the positive TCR range into the negative TCR range. Effective TCR modifiers afford thick film resistors having TCR/resistivity data points to the left of the "universal" curve corresponding to the unmodified resistor system.

Different thick film resistor systems have different "universal" curves and, within each system, the TCR values diminish as the resistivity increases. Since different final applications can tolerate different maximum TCR values, the amount and type of TCR modifier can depend on the particular utilization of the resistor system and on whether the lower or higher resistivity range is necessary. Although no absolute maximum acceptable TCR value is generally known, it is thought that resistors having a TCR value outside of the ±250 ppm/°C. range are unacceptable.

The remainder of the solids content of the resistor composition of this invention, 99–80 parts by weight, comprises a conductive material and glass.

An especially preferred conductive material-glass combination is one in which the conductor is a hexaboride such as lanthanum hexaboride ($LaB_6$), yttrium hexaboride ($YB_6$), the rare earth hexaborides, calcium hexaboride ($CaB_6$), barium hexaboride ($BaB_6$), strontium hexaboride ($SrB_6$) or mixtures thereof and the glass is nonreducible glass. Such a composition is described in a co-pending application to P. C. Donohue Ser. No. 934,269, filed Aug. 16, 1978, filed concurrently with the instant application and is hereby incorporated by reference.

Other commonly known glasses can also be utilized, such conventional glasses contain, among other constituents, MgO, CaO, SrO, BaO, $ZrO_2$, MnO, $Fe_2O_3$, CoO, ZnO, $B_2O_3$. These glasses are prepared by conventional glass-making techniques, by mixing the desired components (or precursors thereof, e.g., $H_3BO_3$ for $B_2O_3$) in the desired proportions and heating the mixture to form a melt. As is well known in the art, heating is conducted to a peak temperature and for a time such that the melt becomes entirely liquid, yet gaseous evolution has ceased. In this work the peak temperature is in the range 1100°–1500° C., usually 1200°–1400° C. The melt is then fritted (particles are made) by cooling the melt, typically by pouring onto a cold belt or into cold running water. Particle size reduction can then be accomplished by milling as desired.

The relative amounts of conductive hexaboride and glass to be utilized can vary depending on the particular application of the final resistor film: 10–95 parts by weight, based on the weight of hexaboride plus glass, of hexaboride and 90–5 parts by weight of glass, preferably 15–50 parts and 85–50 parts, respectively, are useful and preferred ranges.

The solids content of the resistor composition of this invention is dispersed in a vehicle.

Any inert liquid can be used as the vehicle. Water or any one of various organic liquids, with or without thickening and/or stabilizing agents and/or other common additives, can be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle can contain or be composed of volatile liquids to promote fast setting after application to the substrate.

One particularly preferred vehicle, based on copolymers of ethylene and vinyl acetate, is described in a copending application to D. H. Scheiber, Ser. No. 934,271, filed Aug. 16, 1978, filed concurrently with the instant application, and is hereby incorporated by reference.

The ratio of inert liquid vehicle to solids in the resistor compositions of this invention can vary considerably and depends upon the manner in which the dispersion of resistor composition in vehicle is to be applied to the kind of vehicle used. Generally, from 0.5 to 20 parts by weight of solids per part by weight of vehicle can be used to produce a dispersion of the desired consistency. Preferred dispersions contain 10–35 parts by weight of vehicle and 90–65 parts by weight of solids.

The resistor compositions are prepared from the solids and vehicles by mechanical mixing. The resistor compositions of the present invention are printed as a film onto ceramic, alumina or other dielectric substrates in the conventional manner. Generally, screen stenciling techniques are preferably employed. The resulting printed patterns are generally allowed to level out, dried at elevated temperatures such as at 120° C. for approximately 10 minutes, and fired in nonoxidizing atmosphere in a belt furnace at a peak temperature of approximately 910° C.

Preferably, a nitrogen atmosphere is employed in the furnace but other nonoxidizing gases such as hydrogen or a mixture of hydrogen and carbon monoxide can also be used. Also, small quantities of oxygen can also be present during the firing without adversely affecting the final resistor properties. It is believed that a maximum of approximately 100 parts per million of oxygen is permissible; above this level, oxygen appears to have a TCR modifier effect. It is thought that oxygen induces metal oxide formation at the conductor-conductor interfaces imparting semiconducting characteristics to regions of the compositions and thereby acting as a negative TCR modifier. It is, however, possible that depending on the exact nature of hexaboride, glass, and vehicle, higher levels of oxygen can be tolerated without any adverse effect. The preferred range of oxygen content in the nitrogen atmosphere is 3–30 ppm.

Resistance measurements can be carried out in a two-probe procedure utilizing a digital ohmmeter.

TCR measurements are carried out by measuring resistivities ($R_E$; $R_{RT}$) at elevated temperatures ($T_E$) between 125° C. and 150° C. and at room temperature ($T_{RT}$). TCR is calculated from the following formula; in units of ppm/°C.:

$$TCR = \frac{R_E - R_{RT}}{R_{RT}(T_E - T_{RT})}$$

Often, for better comparison, the measured resistivities are normalized to a uniform thickness.

Film thickness (and, also, surface roughness of the films) is measured by a commercial instrument, the Gould surfanalyzer, which records surface profile, thickness values, and surface roughness.

In the Examples below, illustrating the invention, all parts are by weight unless otherwise indicated.

EXAMPLES

EXAMPLES 1-14

A series of resistor compositions is prepared containing incremental amounts of TiO and varying ratios of $LaB_6$ to glass. The solids content is $LaB_6$, vibratorily milled for 7 hours (vibratory milling is carried out in an aqueous medium by placing inorganic powders and steel balls into a container which is then vibrated for a specified length of time) to a surface area of 9.2 m²/g; $TiO_2$, vibratorily milled for 16 hours to a surface area of 4.4 m²/g, and a glass having a surface area of 4.2 m²/g.

The glass is a nonreducible glass prepared from the following constituents (mole%): $B_2O_3$(25.38), $SiO_2$(46.70), $Al_2O_3$(12.69), CaO(12.69), $ZrO_2$(2.03), and $TiO_2$(0.507) and is fully described in copending application, Ser. No. 934,269, filed Aug. 16, 1978, by Donohue.

The resistor composition is prepared into a paste form by dispersing $LaB_6$ and glass in the vehicle by Hoover milling, followed by the addition of different amounts of TiO to the dispersions containing varying ratios of $LaB_6$ and the glass.

The vehicle is a solution of an ethylene-vinylacetate (45/55 by weight) polymer, having a melt flow rate of 1.0, dissolved in hexyl carbitol to provide a 14% by weight solution. The vehicle comprises 30% by weight of the total resistor composition. This vehicle is described in copending application Ser. No. 934,271, filed Aug. 16, 1978, by Scheiber.

The following is the tabulation of the quantities (g.) utilized in preparing the various samples. (The numbers in parentheses indicate the weight ratios of the components of the solids content).

| Example | LaB₆ | glass | TiO | vechicle polymer | solvent |
|---|---|---|---|---|---|
| 1 | 1.8(60) | 1.2(40) | — | 0.18 | 1.11 |
| 2 | 1.5(50) | 1.5(50) | — | 0.18 | 1.11 |
| 3 | 1.2(40) | 1.8(60) | — | 0.18 | 1.11 |
| 4 | 0.9(30) | 2.1(70) | — | 0.18 | 1.11 |
| 5 | 0.6(20) | 2.4(80) | — | 0.18 | 1.11 |
| 6 | 1.8(60) | 0.9(30) | 0.3(10) | 0.18 | 1.11 |
| 7 | 1.5(50) | 0.9(30) | 0.6(20) | 0.18 | 1.11 |
| 8 | 1.5(50) | 0.6(20) | 0.9(30) | 0.18 | 1.11 |
| 9 | 9.6(32) | 20.4(68) | — | 1.8 | 11.1 |
| 10 | 11.7(39) | 18.3(61) | — | 1.8 | 11.1 |
| 11 | 18.0(60) | 12.0(40) | — | 1.8 | 11.1 |
| 12 | 9.6(31.1) | 20.4(66) | 0.9(2.9) | 1.8 | 11.1 |
| 13 | 11.7(37.1) | 18.3(58.1) | 1.5(4.8) | 1.8 | 11.1 |
| 14 | 18.0(56.1) | 12.0(37.4) | 2.1(6.5) | 1.8 | 11.1 |

The resistor compositions prepared above are screen printed over prefired copper electrodes using 325 mesh screens, allowed to level for 10 minutes, dried at 120° C. for 10 minutes, and fired in a belt furnace in a nitrogen atmosphere containing 25-30 ppm of oxygen in the burn-out zone and 3-10 ppm of oxygen in the firing zone. The total firing cycle is 56 minutes, reaching a peak temperature of 910° C. for 6-8 minutes, at a rate of temperature rise and fall of approximately 80-100° C./minute.

The resistivity values are measured as described above and the TCR values are calculated using the equation shown above. Values are tabulated below:

| Example | Resistivity [ohm/square/0.5mil(0.0127mn)] | TCR (ppm/°C.) |
|---|---|---|
| 1 | 10.6 | 430 |
| 2 | 17.9 | 470 |
| 3 | 79.1 | 300 |
| 4 | 1840 | 96 |
| 5 | ∞ | — |
| 6 | 7.6 | 0 |
| 7 | 10.0 | −240 |
| 8 | 7.8 | −480 |
| 9 | 775 | 210 |
| 10 | 82.8 | 340 |
| 11 | 11.7 | 380 |
| 12 | 557 | 118 |
| 13 | 108 | 114 |
| 14 | 13.8 | 169 |

As can be seen from these data, the resistor compositions containing no TiO TCR modifier fall on the "universal" TCR versus R curve within experimental error. (It needs to be recognized that, in working with small quantities of materials, there are introduced relatively large experimental variations especially with respect to sample uniformity and reproducibility of data.)

Examples 6-7 and 12-14 show the beneficial effects of TCR modification by the claimed TCR modifier and show that these resistor compositions are moved off of the "universal" curve. Example 8 affords a thick film resistor having an unacceptably large negative TCR value.

EXAMPLE 15

A resistor composition is prepared from $LaB_6$(0.3 g.), a glass [prepared from SrO(40 mole%), $Al_2O_3$(20 mole%), $B_2O_3$(40 mole%) as per copending Ser. No. 934,269, filed Aug. 16, 1978, 0.2 g.], Si(0.02 g.), and a vehicle of 10% by weight of ethyl cellulose [having a viscosity of 22 centipoises in a 5% by weight solution in a solvent of toluene/ethanol//80/20 (by weight), 47.5-49.0% ethoxy content, and 2.4-2.53 ratio of ethoxy groups to anhydro-glucose units] in β-terpeneol, in a manner described above. The vehicle is present in a quantity sufficient to prepare a printable paste.

Thick film resistors are prepared as in Examples 1-14, having an average TCR value of −107.

EXAMPLES 16-19

A series of resistor compositions, containing varying levels of Ge, is prepared from $LaB_6$, a glass [prepared from $B_2O_3$(33.6 mole%), $SiO_2$(44.7 mole%), $Al_2O_3$(6.7 mole%), CaO(15 mole%), as per the copending patent application referred to in Example 15 above], and a vehicle, in a manner described above. Thick films are prepared as in Examples 1-14.

The following is the tabulation of the quantities (g.) utilized in preparing the various samples. (The numbers in parenthesis indicate the weight ratios of the components of the solids content.)

| Example | $LaB_6$ | Glass | Ge | Vehicle[1] |
|---------|---------|-------|------|------------|
| 16 | 3.4(68) | 1.6(32) | 0 | 2.82 |
| 17 | 3.4(68) | 1.6(32) | 0.25(5) | 2.82 |
| 18 | 3.4(68) | 1.6(32) | 0.50(10) | 2.82 |
| 19 | 3.4(68) | 1.6(32) | 1.0 (70) | 2.82 |

[1]The vehicle contains 1.25 g. of a commercial hydroxy-terminated polybutadiene, 0.67 g. of a 25% by weight solution of polyiso-butyl methacrylate (inherent viscosity = 0.7 deciliter/gram, measured at 20° C. in a solution of 0.25 g. of polymer in 50 ml. of chloroform) in 2,2,4-trimethylpentadiol-1,3-monoisobutyrate, and 0.90 g. more of this same solvent.

The resistivity values are measured as described above and the TCR values are calculated using the equation shown above. Values are tabulated below:

| Example | Resistivity [ohm/square/0.5mil(0.0127mm)] | TCR (ppm°C.) |
|---------|-------------------------------------------|--------------|
| 16 | 14 | 500 |
| 17 | 14 | 300 |
| 18 | 17 | 280 |
| 19 | 28 | 190 |

As can be seen from these data, Ge is an effective TCR modifier.

EXAMPLES 20-25

A series of resistor compositions, containing various levels of graphite (crystalline), is prepared from $LaB_6$, glass (same as in Examples 16-19), and a vehicle, in a manner described above. Thick film resistors are prepared as in Examples 1-14.

The following is the tabulation of the quantities (g.) utilized in preparing the various samples. (The numbers in parentheses indicate the weight ratios of the components of the solids content.)

| Example | $LaB_6$ | Glass | Graphite | Vehicle[1] |
|---------|---------|-------|----------|------------|
| 20 | 4.2(84) | 0.8(16) | 0 | 282 |
| 21 | 4.2(84) | 0.8(16) | 0.05(1) | 282 |
| 22 | 4.2(84) | 0.8(16) | 0.25(5) | 282 |
| 23 | 4.2(84) | 0.8(16) | 0.50(10) | 282 |
| 24 | 4.2(84) | 0.8(16) | 1.0 (20) | 282 |
| 25 | 4.2(84) | 0.8(16) | 1.5 (30) | 282 |

[1]The vehicle contains 1.25 g. of a commercial hydroxy-terminated polybutadiene, 0.67 g. of a 25% by weight solution of polyiso-butyl methacrylate (inherent viscosity = 0.7 deciliter/gram, measured at 20° C. in a solution of 0.25 g. of polymer in 50 ml. of chloroform) in 2,2,4-trimethylpentadiol-1,3-monoisobutyrate, and 0.90 g. more of this same solvent.

The resistivity values are measured as described above and the TCR values are calculated using the equation shown above. Values are tabulated below:

| Example | Resistivity [ohm/square/0.5mil(0.0127mm)] | TCR (ppm°C.) |
|---------|-------------------------------------------|--------------|
| 20 | 6 | 600 |
| 21 | 8 | 440 |
| 22 | 8 | 360 |
| 23 | 8 | 200 |
| 24 | 15 | 60 |
| 25 | 44 | −360 |

As can be seen from these data, Examples 23-24 exemplify useful levels of graphite as TCR modifier for this particle combination of hexaboride, glass, and vehicle.

We claim:
1. A resistor composition consisting essentially of inorganic powder solids content dispersed in an organic vehicle wherein the solids content consists essentially of
   A. 1-20 parts by weight, based on the weight of the solids, of TCR modifier which is substantially non-reactive with and nonreducible by the conductive material selected from the group consisting of TiO, its higher oxidation state precursors $Ti_3O_5$ and $Ti_2O_3$; NbO; TaO; C; Si; Ge; SiC; compounds based on Groups IIIA and VA of the periodic chart of the elements; compounds based on Groups IIB and VIA of the periodic chart, rare earth nitrides and Group III B nitrides.
   B. 99-80 parts by weight, based on the weight of the solids, of
      a. 10-95 parts by weight, based on the weight of (a) plus (b), of conductive material selected from the group consisting of $LaB_6$, $YB_6$, rare earth hexaborides, $CaB_6$, $BaB_6$ and $SrB_6$; and
      b. 90-5 parts by weight, based on the weight of (a) plus (b), of glass; and wherein the composition is compatible with copper conductors and is fireable in substantially nonoxidizing atmosphere.
2. The resistor composition of claim 1 wherein said glass is substantially nonreducible by the conductive material.
3. The resistor composition of claim 1 wherein the TCR modifier is present to the extent of 2.5-10 parts by weight based on the weight of solids.
4. The resistor composition of claim 1 wherein the TCR modifier is present to the extent of 1-4 parts by weight based on the weight of solids.
5. The resistor composition of claim 1 wherein said organic vehicle is a solution of ethylene-vinyl acetate polymer containing at least 53% by weight of vinyl acetate.
6. The resistor composition of claim 1 or claim 2 wherein said TCR modifier is TiO.

* * * * *